(12) United States Patent
Preuss et al.

(10) Patent No.: US 7,522,036 B1
(45) Date of Patent: Apr. 21, 2009

(54) INTEGRATED POWER AND ENVIRONMENTAL MONITORING ELECTRICAL DISTRIBUTION SYSTEM

(75) Inventors: Jesse Preuss, Lincoln, NE (US); Brad Wilson, Lincoln, NE (US); Tom Kennedy, Lincoln, NE (US)

(73) Assignee: Geist Manufacturing, Inc., Lincoln, NE (US)

( * ) Notice: Subject to any disclaimer, the term of this patent is extended or adjusted under 35 U.S.C. 154(b) by 184 days.

(21) Appl. No.: 11/321,758

(22) Filed: Dec. 29, 2005

Related U.S. Application Data

(60) Provisional application No. 60/639,933, filed on Dec. 29, 2004.

(51) Int. Cl.
  *G08B 17/10* (2006.01)
  *H02B 1/26* (2006.01)
  *H02J 7/00* (2006.01)

(52) U.S. Cl. ............... 340/531; 340/602; 340/657; 361/624; 307/150

(58) Field of Classification Search ......... 340/531, 340/602, 635, 636.12, 636.13, 636.15, 636.18, 340/657, 660–664; 361/624, 601, 648; 174/59; 307/31, 34, 39, 118, 126, 150
See application file for complete search history.

(56) References Cited

U.S. PATENT DOCUMENTS

| | | | |
|---|---|---|---|
| 6,301,095 B1 * | 10/2001 | Laughlin et al. | 361/624 |
| 6,714,977 B1 | 3/2004 | Fowler et al. | 709/224 |
| 6,741,442 B1 * | 5/2004 | McNally et al. | 361/166 |
| 6,826,036 B2 * | 11/2004 | Pereira | 361/624 |
| 7,043,543 B2 * | 5/2006 | Ewing et al. | 709/223 |
| 7,116,550 B2 * | 10/2006 | Ewing et al. | 361/623 |
| 7,196,900 B2 * | 3/2007 | Ewing et al. | 361/642 |
| 7,268,998 B2 * | 9/2007 | Ewing et al. | 361/622 |

OTHER PUBLICATIONS

Environmental Monitoring—A Storage Essential; Drew Robb; http://www.enterprisestorageforum.com/management/features/print.php/3110621; Nov. 18, 2003.

How Power Monitoring can Save your Data Center; Ellen Leinfuss; http://www.datacenterjournal.com/News/Articles.asp?article_id-178; Sep. 13, 2004.

Environmental Monitoring Card (formerly known as Measure-UPS II); Bomara Associates; http://www.bomara.com/APC/accessories-environmental.htm; Dec. 15, 2004.

(Continued)

*Primary Examiner*—Toan N Pham
(74) *Attorney, Agent, or Firm*—Suiter Swantz pc llo

(57) ABSTRACT

A power and environmental monitoring system includes a power distribution unit, a power monitoring system including an internal sensor for monitoring power consumption characteristics of power supplied to equipment coupled with the power distribution unit, an environmental monitoring system including an internal sensor for monitoring environmental characteristics in a physical environment occupied by the power and environmental monitoring system, and a network connection. The power monitoring system and the environmental monitoring system share a common interface accessible via the network connection. The power distribution unit includes an I/O port for connecting an external sensor, and the environmental monitoring system is configured for receiving environmental characteristics sensed by the external sensor. The common interface comprises a series of Web pages for displaying characteristics sensed by the power monitoring system and the environmental monitoring system. An alarm is provided for alerting an operator that a characteristic has reached an alarm threshold.

20 Claims, 11 Drawing Sheets

OTHER PUBLICATIONS

Monitoring Branch Circuits in Critical Facilities; Jim Lewis; http://www.datacenterjournal.com/News/Article.asp?article_id-170; Aug. 30, 2004.

What is Power Factor?; The Data Center Journal; http://www.datacenterjournal.com/News/Articles.asp?article_id-168; Aug. 30, 2004.

Rack Level Power Distribution with Current Monitoring; www.power-watch.com; Dec. 15, 2004.

OpenComms™ EM Product Specification.Installation Sheet; Liebert Corporation; © 2004.

UPS—Uninterruptible Power Supply Access; Provantage; http://www.provantage.com/buy-66UPSAC_2-ups-uninterruptible-power-supply-access-s . . . ; Dec. 15, 2004.

Hawk-i—Advanced Rack Monitoring; Sinetica Corporation; http://www.sinetica.co.uk/hawk-i.htm; Dec. 15, 2004.

Power View Enhanced PDU; Black Box Corporation; Feb. 9, 2004.

APC Metered PDU ZeroU—Power distribution strip (rack-mountable)—AC 230 V—EN, Fast EN—24 Output Connector(s); Insight; http;//uk.insight.com/apps/productpresentation/index.php?product_id=APCUA03PJH&st . . . ; Dec. 15, 2004.

Server Environment Monitoring System; Network Technologies Inc.; http//www.ntil.com/enviro-rems.html; Dec. 15, 2004.

Applications—Data Center Monitoring; AKCP Inc.; http://www.akcpinc.com/company/datacentre.htm; Dec. 15, 2004.

How NetBotz Works; NetBotz; http://www.netbotz.com/; Dec. 15, 2004.

SensorProbe8; Ravica; http://www.javica.com/sensorprobe8.htm; Dec. 15, 2004.

RPS30 Series; Bay Tech; http://www.baytechcd.com/cgi-private/prodist?show=RPS30; Dec. 15, 2004.

Power Tower EMCU, Equipment Cabinet Environment Monitoring; Server Technology, Inc; http://www.servertech.com/products/EnvironmentalMonitoring/EMCU-1/; Dec. 15. 2004.

\* cited by examiner

FIG. 7

INTEGRATED POWER AND ENVIRONMENTAL MONITORING ELECTRICAL DISTRIBUTION SYSTEM

CROSS-REFERENCE TO RELATED APPLICATIONS

The present application claims the benefit under 35 U.S.C. § 119(e) of U.S. Provisional Application Ser. No. 60/639,933, filed Dec. 29, 2004, which is herein incorporated by reference in its entirety.

FIELD OF THE INVENTION

The present invention generally relates to the field of power and environmental monitoring, and more particularly to a stand alone system for integrating a power and environmental monitoring system and a power distribution system.

BACKGROUND OF THE INVENTION

With the dramatic increase in the use of the Internet as the backbone for corporate and personal communications, there is a growing demand for data centers that serve as centralized locations for hosting servers and ancillary equipment. Modern technological advances have allowed such data centers to accommodate large numbers of servers in increasingly small areas. Thus, more and more servers may be fitted into a typical server rack, which requires managing server racks with high energy densities. One of the challenges that data center managers face is supplying sufficient power to each rack in order to prevent breaker overloads and downtimes. There have been many attempts to provide various power monitoring systems which allow a data center manager to determine when high loading levels occur.

Additionally, the physical environment occupied by equipment in a data center is critical for availability, security, and reliability. The physical environment may include such environmental factors as temperature, humidity, fire, water, and the like, which may influence the performance of data storage and processing equipment. There have been many attempts to provide environmental monitoring systems for measuring and monitoring environmental factors, as well as for alerting data center administrators to such environmental factors.

Thus, power distribution and monitoring, as well as environmental monitoring, for servers and other various equipment is critical for providing reliable and secure data centers. However, data center managers may have difficulty implementing individual monitoring systems and power distribution systems which have been developed by different vendors. Further, it may be difficult to provide an integrated software interface for the various power distribution and environmental monitoring systems.

Consequently, it would be desirable to provide an integrated monitoring system for monitoring various environmental factors, as well as performing power monitoring. It would also be advantageous if such a system supplied sufficient power to servers and ancillary equipment in order to prevent breaker overloads and downtimes, and issued alerts to potential problems. Further, it would be desirable to provide a stand alone integrated monitoring system which would not require the installation of client software.

SUMMARY OF THE INVENTION

Accordingly, the present invention is directed to a power and environmental monitoring system, having a power distribution unit, a power monitoring system, an environmental monitoring system, and a network connection. The power monitoring system and the environmental monitoring system share a common interface accessible via the network connection.

The power monitoring system monitors power consumption characteristics of power supplied to equipment coupled with the power distribution unit. In embodiments, the power monitoring system includes an internal sensor in the power distribution unit for sensing power consumption characteristics such as voltage and current and also includes software for calculating other power consumption characteristics such as watts, Volt Amps, and Power Factor.

The environmental monitoring system monitors environmental characteristics in a physical environment occupied by the power and environmental monitoring system. In embodiments, the environmental monitoring system includes an internal sensor in the power distribution unit for sensing environmental characteristics including temperature, humidity, airflow, light level, and sound level. Preferably, the power distribution unit includes an input/output (I/O) port for connecting an external sensor, and the environmental monitoring system is configured for receiving environmental characteristics sensed by the external sensor. External sensors include a temperature sensor having a temperature probe; a combined temperature and airflow sensor; a combined temperature, airflow, and humidity sensor; an external contact closure type sensor acting as a conductivity bridge for moisture detection; a magnetic switch; and a smoke alarm.

The common interface comprises a series of Web pages for displaying power consumption characteristics and environmental characteristics sensed by the power monitoring system and the environmental monitoring system. The power and environmental monitoring system provides an alarm for alerting an operator that a power consumption characteristic or an environmental characteristic has reached an alarm threshold, which is specified by an operator utilizing the common interface. The common interface may also communicate with and display static or live images from an electronic web based camera that is not directly connected to the unit.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 7 illustrates a display page for a common interface provided by a power and environmental monitoring system in accordance with an exemplary embodiment of the present invention, wherein the display page provides a user friendly environment;

DETAILED DESCRIPTION OF THE INVENTION

Figure 1:
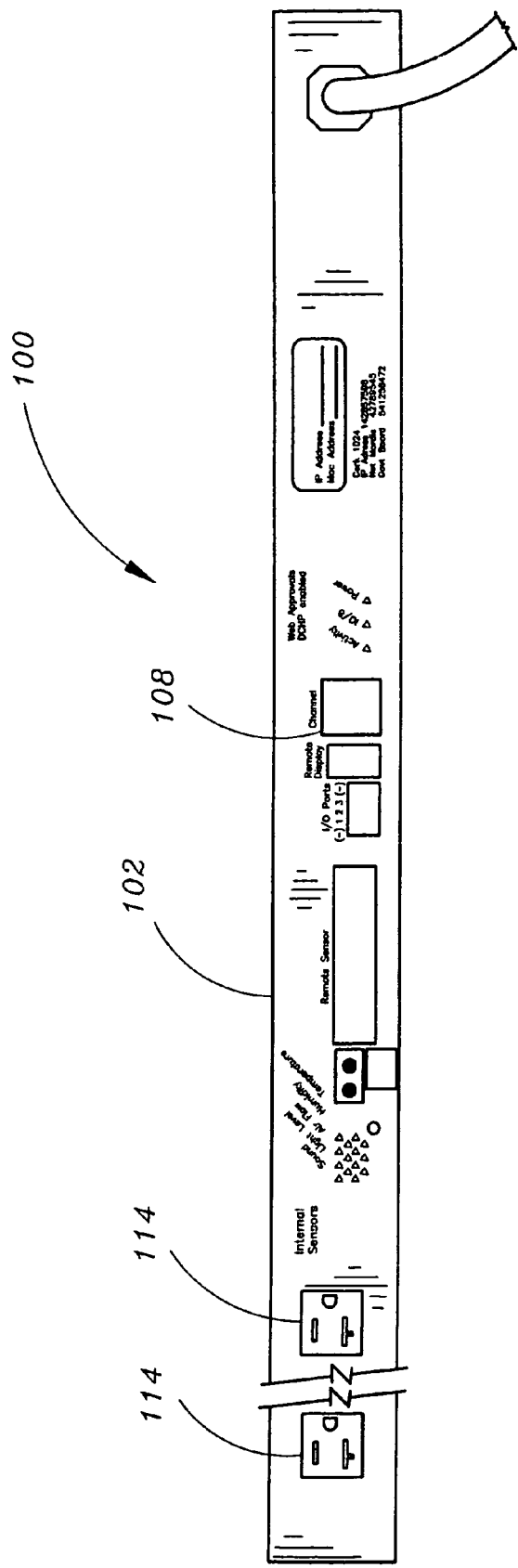
FIG. 1 is a front view illustrating a power and environmental monitoring system in accordance with an exemplary embodiment of the present invention.
Figure 2:
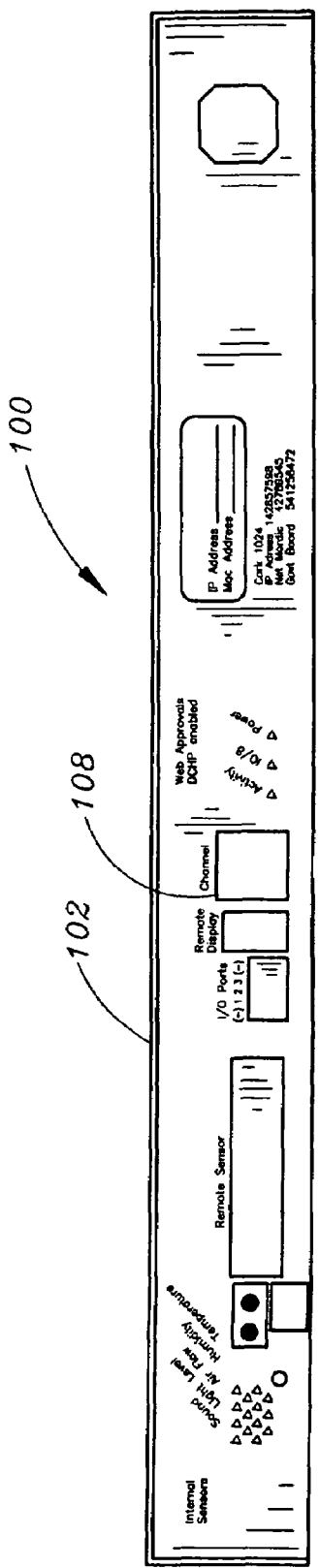
FIG. 2 is a back view illustrating a power and environmental monitoring system in accordance with another exemplary embodiment of the present invention.
Figure 3:
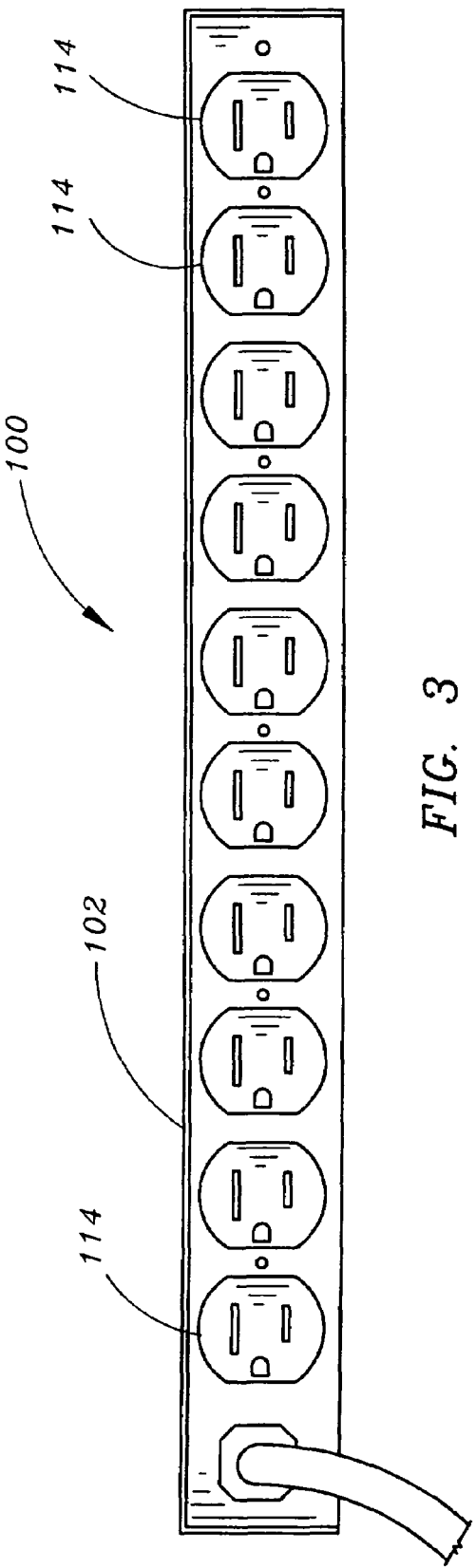
FIG. 3 is a front view of the power and environmental monitoring system illustrated in FIG. 2.

Reference will now be made in detail to the presently preferred embodiments of the invention, examples of which are illustrated in the accompanying drawings.

Referring now to FIGS. 1 through 13, a power and environmental monitoring system 100 is described in accordance with exemplary embodiments of the present invention. The power and environmental monitoring system 100 includes a power distribution unit 102 for supplying power to equipment (i.e., one piece of equipment or multiple pieces of equipment), such as servers and ancillary equipment utilized in data centers, and the like. A power monitoring system 104 is included for monitoring the power consumption of the equipment coupled with the power distribution unit 102, and an environmental monitoring system 106 is included for monitoring the physical environment occupied by the power and environmental monitoring system 100. A network connector 108 is included for connecting the power and environmental monitoring system 100 to a network 110. The power monitoring system 104 and the environmental monitoring system 106 share a common interface 112 accessible via the network connector 108.

As shown, the power distribution unit 102 includes a receptacle 114 for supplying power to equipment coupled with the power distribution unit 102, such as for supplying power to a server. In specific embodiments, the equipment is coupled with the power distribution unit 102 via the receptacle 114. For example, in one specific embodiment, illustrated in FIG. 1, the power distribution unit 102 includes a National Electrical Manufacturers Association (NEMA) 20 amp receptacle for powering equipment coupled with the power distribution unit 102 via the NEMA 20 amp receptacle. In another specific embodiment, illustrated in FIGS. 2 and 3, the power distribution unit 102 includes a NEMA 15 amp receptacle for powering equipment coupled with the power distribution unit 102. The use of power distribution units having receptacles other than those specifically illustrated herein is well known in the art. Consequently, the substitution of such receptacles in place of the receptacles 114 specifically illustrated in the accompanying figures does not depart from the scope and intent of the present invention. For example, the power distribution unit 102 may include an International Electrotechnical Commission (IEC) 15 amp receptacle for powering equipment coupled with the power distribution unit 102 via the IEC 15 amp receptacle.

It will be appreciated that the power distribution unit 102 may include equipment and connectors other than the receptacle 114 for supplying power to equipment coupled with the power distribution unit 102. In exemplary embodiments, the power distribution unit 102 is coupled with a supply of electrical power, such as an electrical outlet or the like, for distributing electrical power from the electrical outlet to equipment coupled with the power distribution unit 102 via the receptacle 114. However, those of skill in the art will appreciate that the power distribution unit 102 may be connected to other power sources for supplying power to equipment coupled with the power distribution unit 102. Moreover, it will be appreciated that the power distribution unit 102 may include its own internal source of power, comprising a battery, a generator, and other power sources as contemplated by one of skill in the art. Further, it will be appreciated that the use of devices for conditioning power supplied to equipment coupled with the power distribution unit 102, such as signal conditioners and the like, is well know in the art. Also, the use of devices for protecting equipment coupled with the power distribution unit 102 from voltage fluctuations and overload conditions, including surge suppressors, circuit breakers, fuses, and the like, is well known in the art. Consequently, the use of power conditioning, surge suppressors, circuit breakers, fuses, and other such devices with the power distribution unit 102 would not depart from the scope and spirit of the invention.

In embodiments, the power monitoring system 104 monitors the power consumption of equipment coupled with the power distribution unit 102, such as equipment coupled with the power distribution unit 102 via the receptacle 114. For example, the power monitoring system 104 may include a built in sensor, such as an internal sensor 116 disposed in the power distribution unit 102, for sensing a power consumption characteristic such as voltage, current, and power factor for equipment coupled with the power distribution unit 102. Alternatively, other power consumption characteristics may be sensed by the internal sensor 116 as well. The power consumption characteristics may be utilized by the power and environmental monitoring system 100 in a variety of ways for providing information to an operator. For instance, the power monitoring system 104 may measure both Root Mean Square (RMS) and peak values for power consumption characteristics of power supplied to equipment coupled with the power distribution unit 102. In one specific embodiment, for example, the power monitoring system 104 measures both RMS and peak values for voltage and current supplied to equipment. These values are then utilized to calculate Volt-amp (VA) and watt values for the power consumption of the equipment.

It will be appreciated that power consumption characteristics measured by the power monitoring system 104 may be utilized by the power and environmental monitoring system 100 to calculate other information regarding the power consumption of equipment coupled with the power distribution unit 102 as well, without departing from the scope and intent of the present invention. For instance, in embodiments, power consumption characteristics for power supplied to equipment coupled with the power distribution unit 102 are utilized to calculate a power factor for the equipment. Further, it will be appreciated that any one or a combination of the internal sensor 116, the power monitoring system 104, and/or the power and environmental monitoring system 100 may perform such calculations.

In embodiments, the environmental monitoring system 106 monitors the physical environment occupied by the power and environmental monitoring system 100, such as the physical environment of a data center, the physical environment within a server rack, or another physical environment occupied by the power and environmental monitoring system 100 as contemplated by one of skill in the art. For example, the environmental monitoring system 106 may include an on board sensor, such as an internal sensor 118 disposed in the power distribution unit 102, for sensing an environmental characteristic such as temperature, humidity, airflow, light level, and sound level for the physical environment occupied by the power and environmental monitoring system 100. Alternatively, other environmental characteristics may be sensed by the internal sensor 118 as may be required by a particular application.

Preferably, the power and environmental monitoring system 100 includes an input/output (I/O) port 120 for connecting an additional sensor, such as an external (remote) sensor 122 disposed outside of the power distribution unit 102. External sensors 122 may be utilized for monitoring multiple cabinets, trouble spots within a cabinet, an entire room, and, more generally, environmental characteristics external to the immediate environment of the power and environmental monitoring system 100. In embodiments, the environmental monitoring system 100 is configured for receiving an environmental characteristic sensed by the external sensor 122. The external sensor 122 may comprise a variety of sensor types, including a temperature sensor having a temperature probe; a combined temperature and airflow sensor; a combined temperature, airflow, and humidity sensor; an external contact closure type sensor acting as a conductivity bridge for measuring moisture/water; a magnetic switch; a smoke alarm; or another type of sensor as contemplated by one of skill in the art.

In one specific embodiment, the external sensor 122 comprises a temperature sensor including a temperature probe for monitoring hot spots within a server rack. In another embodiment, the external sensor 122 comprises a temperature sensor and an airflow sensor, which are both connected through a single I/O port 120 for monitoring hot spots within the server rack, or, alternatively, monitoring air conditioning vents. In a further embodiment, the external sensor 122 comprises a contact closure type sensor acting as a conductivity bridge to sense water within a physical location. In another embodiment, the external sensor 122 comprises a magnetic switch that opens with a door disposed in a server rack for indicating the door has been opened. It is contemplated that multiple door switches may be wired via a series connection through a single I/O port 120. Then, if the chain of switches is broken (i.e., when a door is opened), the entire group of switches is classified as open. In other embodiments, the external sensor 122 comprises a smoke alarm; a combined temperature, airflow, and humidity sensor; a combined temperature and humidity sensor; an air quality sensor; a motion sensor; and/or a light sensor.

The external sensors 122 are utilized for monitoring multiple cabinets, monitoring specific areas within an individual cabinet, or, alternatively, for monitoring various locations throughout an entire area, such as a server room, or another type of external environment. In embodiments, additional external sensors may be added to the power and environmental monitoring system 100 up to the capacity of the system, which may depend upon such factors as signal strength degradation due to cable run length and branching topology. For example, in one specific embodiment, up to 16 external sensors 122 may be added to the power and environmental monitoring system 100 utilizing splitters and/or hubs. In this embodiment, the external sensors 122 utilize serial communication and are subject to network signaling constraints dependent upon shielding, environmental noise, length of wire, and other factors. While exemplary external sensors 122 have been described with some specificity, those of skill in the art will appreciate that differing quantities and varieties of external sensors may be utilized with the present invention without departing from the scope and intent thereof.

In embodiments, a network camera (e.g., an external web/IP camera) may be linked to the power and environmental monitoring system 100 via the network 110. Preferably, the power and environmental monitoring system 100 is configured for receiving an Internet Protocol (IP) address, or, alternatively, another network address, for linking with the network camera and receiving camera information. The information from the camera may then be provided by the power and environmental monitoring system 100 along with other information collected by the system. Thus, the network camera is not directly connected to the power and environmental monitoring system 100, but is linked by its IP address.

In embodiments, the common interface 112 accessible via the network connector 108 comprises a Web page (i.e., a document comprising a Hyper Text Markup Language (HTML) file and any related files for scripts and graphics, often including hyperlinks to other documents) provided by the power and environmental monitoring system 100 and supplied via the network connector 108. For example, in one specific embodiment, an operator may utilize the network connector 108 for connecting the power and environmental monitoring system 100 to a network 110, such as a Local Area Network (LAN), a Wireless Local Area Network (WLAN), a Wireless Fidelity (Wi-Fi) network, a Wide Area Network (WAN), a Virtual Private Network (VPN), an internet, the Internet, and other networks as contemplated by one of skill in the art. An operator may then access the common interface 112 by connecting an information handling system device 124 to the network 110, such as a Personal Computer (PC), a Personal Digital Assistant (PDA), a wireless telephone, or another information handling system device configured for connecting to the network 110. Alternatively, in another specific embodiment, the operator may utilize the network connector 108 for connecting the power and environmental monitoring system 100 directly to the information handling system device 124, such as by linking the power and environmental monitoring system 100 with a PC utilizing a crossover cable, a hub, or the like.

It will be appreciated that the power and environmental monitoring system 100 may be connected to the information handling system device 124 in a variety of ways without departing from the scope and intent of the present invention. Further, it will be contemplated that the network connector 108 may utilize a variety of techniques for connecting to the network 110. For example, in one specific embodiment, the network connector 108 comprises an Ethernet port for connecting the power and environmental monitoring system 100 to the network 110 via an Ethernet networking cable, while in another specific embodiment, the network connector 108 comprises a wireless networking card, or another wireless networking device, for connecting to a Wi-Fi network. Those of skill in the art will appreciate that network connectors 108 for use with the power and environmental monitoring system 100 of the present invention may incorporate a variety of networking technologies without departing from the scope and intent of the present invention.

Figure 4:
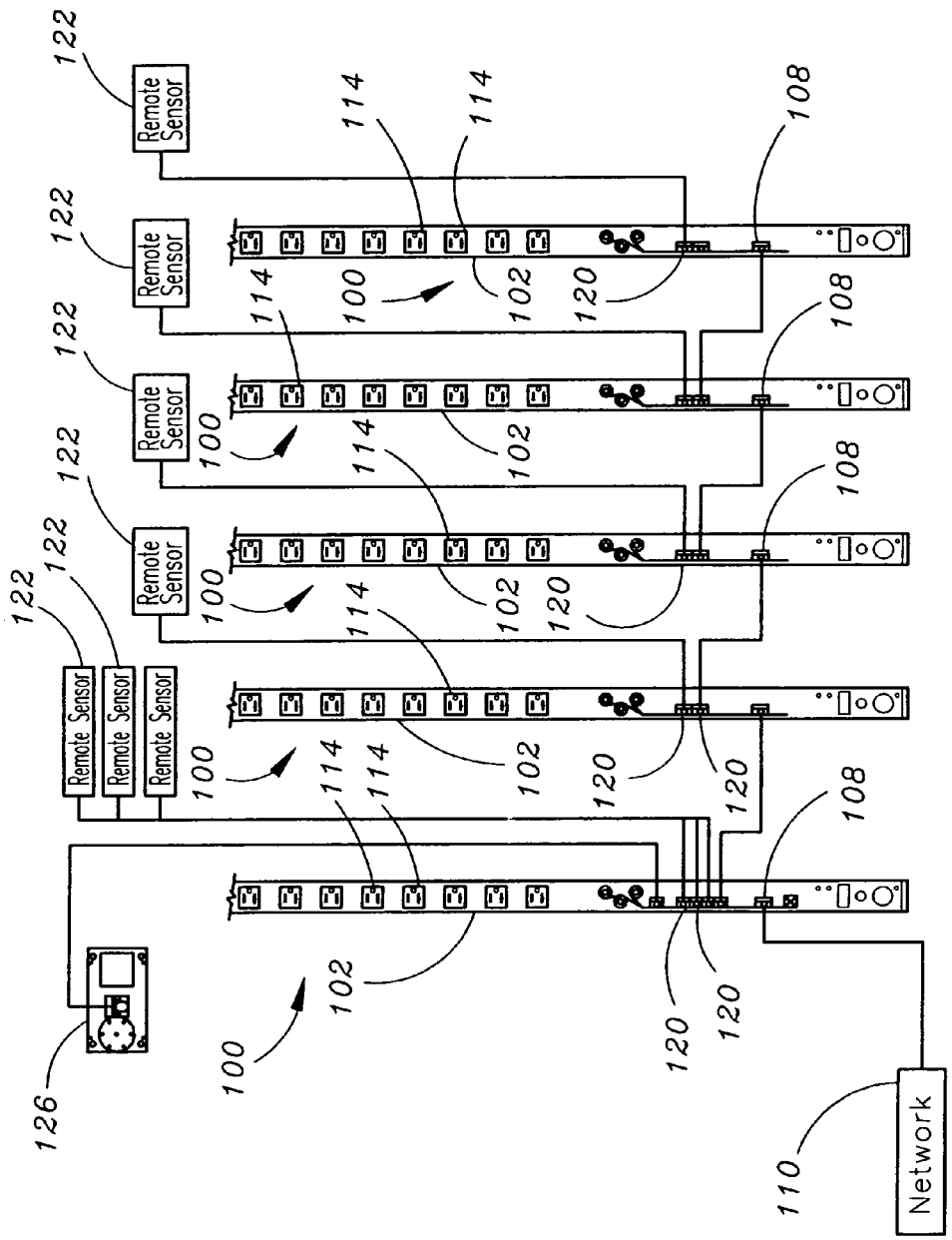
FIG. 4 is a block diagram illustrating multiple power and environmental monitoring systems connected to a network in accordance with an exemplary embodiment of the present invention, wherein one of the power and environmental monitoring systems functions as a "master" unit, while the other power and environmental monitoring systems function as "slave" units.

In an exemplary embodiment, illustrated in FIG. 4, the network 110 includes multiple power and environmental monitoring systems 100. In this embodiment, one of the power and environmental monitoring systems 100 functions as a "master" unit (e.g., controlling the operation of another power and environmental monitoring system 100 and/or collecting power and environmental characteristics therefrom), while another power and/or environmental monitoring system 100 functions as a "slave" unit (e.g., controlled by a master unit and/or interfaced with the network 110 via the master unit). Preferably, the power and environmental monitoring system 100 configured as the slave unit includes a power distribution unit 102 for supplying power to equipment, a power monitoring system 104 for monitoring the power consumption of the equipment, and I/O ports 120 for connecting one or more additional sensors, such as an external sensor 122. In embodiments, each power and environmental monitoring system 100 configured as a slave unit is connected to another power and environmental monitoring system 100 via an I/O port 120. Preferably, the power and environmental monitoring system 100 configured as the master unit includes a network connector 108 for interfacing with the network 110. The master unit may also include additional networking connectors for interfacing with one or more slave units. Alternatively, the master unit may interface with a slave unit, or multiple slave units, utilizing one or more I/O ports 120 as previously described.

While an exemplary power and environmental monitoring system 100 configured as a slave unit has been described with some specificity as including the power distribution unit 102, the power monitoring system 104, and the I/O ports 120, those of skill in the art will appreciate that power and environmental monitoring systems 100 configured as slave units may include other components as well, including an environmental monitoring system 106 for monitoring the physical environment occupied by the power and environmental monitoring system 100, a network connector 108 for connecting to an I/O port 120 or to the network 110, and other components as needed. For example, in another specific embodiment, multiple, identical power and environmental monitoring systems 100 are connected over the network 110. In this embodiment, a power and environmental monitoring system 100 configured as a slave unit may be physically and/or functionally identical to a power and environmental monitoring system 100 configured as a master unit, but may function as either of a slave unit and a master unit based on its position in the hierarchy of the network 110.

In embodiments, a power and environmental monitoring system 100 connected directly to the network 110 may function as a master unit, while another power and environmental monitoring system 100 connected to the network 110 via the master unit may function as a slave unit. Those of skill in the art will appreciate that exemplary power and environmental monitoring systems 100 may be configured manually, and may also include hardware, software, firmware, and the like for sensing their position in the network hierarchy and functioning as a master unit or a slave unit accordingly. Further, it will be appreciated that other power and environmental monitoring systems 100 configured to operate on the network 110 may be utilized as well, including power and environmental monitoring systems 100 utilizing hierarchical topologies other than a master/slave topology. Moreover, it will be appreciated that power and environmental monitoring systems 100 may communicate with one another utilizing various network protocols as is well known in the art.

In the embodiment illustrated in FIG. 4, the power and environmental monitoring system 100 includes a tethered display 126, such as a tethered local display comprising a Liquid Crystal Display (LCD) monitor, a Cathode Ray Tube (CRT) monitor, a plasma screen, or another type of display as contemplated by one of skill in the art. For instance, in one specific embodiment, the tethered display 126 comprises a two line by eight character LCD display for displaying power consumption characteristics and environmental characteristics sensed by the power monitoring system 104 and the environmental monitoring system 106. Preferably, the tethered display 126 is for on-site monitoring of the power and environmental monitoring system 100. For instance, the tethered display 126 may comprise a module sized appropriately for mounting within a server rack or cabinet, including a 12 foot handset type four-conductor cable, or the like, for connecting the tethered display 126 to the power and environmental monitoring system 100.

In embodiments, the tethered display 126 may include various audio output devices, including a buzzer, a speaker, an alarm bell, and other devices for providing audio output to an operator as contemplated by one of skill in the art. Further, the tethered display 126 may include an alarm reset for silencing an audio output device when a problem has been located and/or resolved. While the tethered display 126 has been described with some specificity, the use of other displays, including displays having only an audio output device, does not fall outside of the scope and intent of the present invention. Moreover, it is contemplated that multiple tethered displays 126 may be added to the power and environmental monitoring system 100 for monitoring from various on-site locations.

In embodiments, the common interface 112 is for displaying power consumption characteristics and environmental characteristics sensed by the power monitoring system 104 and the environmental monitoring system 106. For instance, the common interface 112 may be configured for presenting power consumption characteristics and/or environmental characteristics in the form of real time graphs, such as for trend analysis and monitoring. Preferably, the common interface 112 comprises a Web page, a series of Web pages, and/or another interface as contemplated by one of skill in the art, which may be accessed via the network connector 108 without requiring client software other than a browser, such as a Web browser, or a like application, to be installed on the information handling system device 124. However, it is contemplated that the power and environmental monitoring system 100 may provide a common interface 112 requiring special software to be installed on the information handling system device 124.

Those of skill in the art will appreciate that the common interface 112 may comprise other interfaces as well, without departing from the scope and intent of the present invention. For example, in one specific embodiment, the power and environmental monitoring system 100 maintains a database of power consumption characteristics and environmental characteristics sensed by the power monitoring system 104 and the environmental monitoring system 106. Utilizing SNMP, the common interface 112 provides the information handling system device 124 with a Management Information Base (MIB) formatted description of the power consumption characteristics and environmental characteristics stored in the database. The information handling system device 124 then utilizes the MIB for accessing the power and environmental monitoring system 100 via the common interface 112 and retrieving power consumption characteristics and environmental characteristics as needed.

The common interface 112 may comprise Web pages encoded in a variety of formats and protocols for compatibility with various types of information handling system devices 124. For example, exemplary Web pages may be configured for communications protocols for Web browsing such as Hyper Text Transfer Protocol (HTTP), communications standards for exchanging data such as Standardized Generalized Markup Language (SGML) and Extensible Markup Language (XML), protocols designed for compatibility with Personal Digital Assistants (e.g., PDA friendly formats), protocols designed for mobile telephones and other wireless devices such as Wireless Application Protocol (WAP), as well as protocols specifically designed for various networking schemes, including HTTP, Telnet, Simple Mail Transfer Protocol (SMTP), and Simple Network Management Protocol (SNMP). It will be appreciated that the formats and protocols described herein are exemplary and explanatory only, and not meant to be restrictive of formats and protocols which may be utilized with the present invention. Those of skill in the art will appreciate that other formats and protocols may be utilized for providing Web pages without departing from the scope and intent of the present invention.

Figure 10:
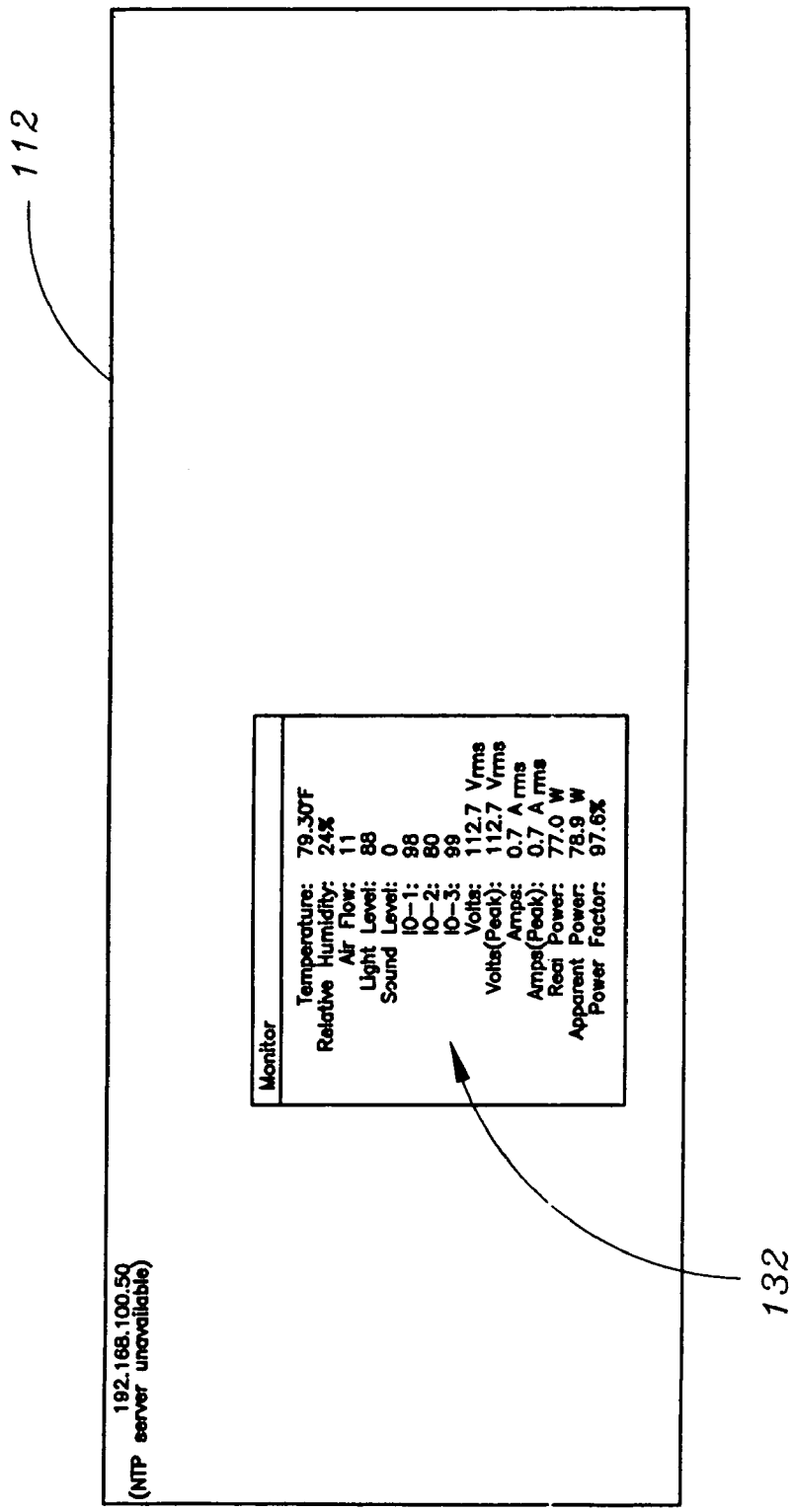
FIG. 10 illustrates a common interface provided by a power and environmental monitoring system in accordance with another exemplary embodiment of the present invention, wherein the common interface is displayed in a smaller version for compatibility with a PDA, a mobile telephone, or another device including a smaller sized display.
Figure 11:
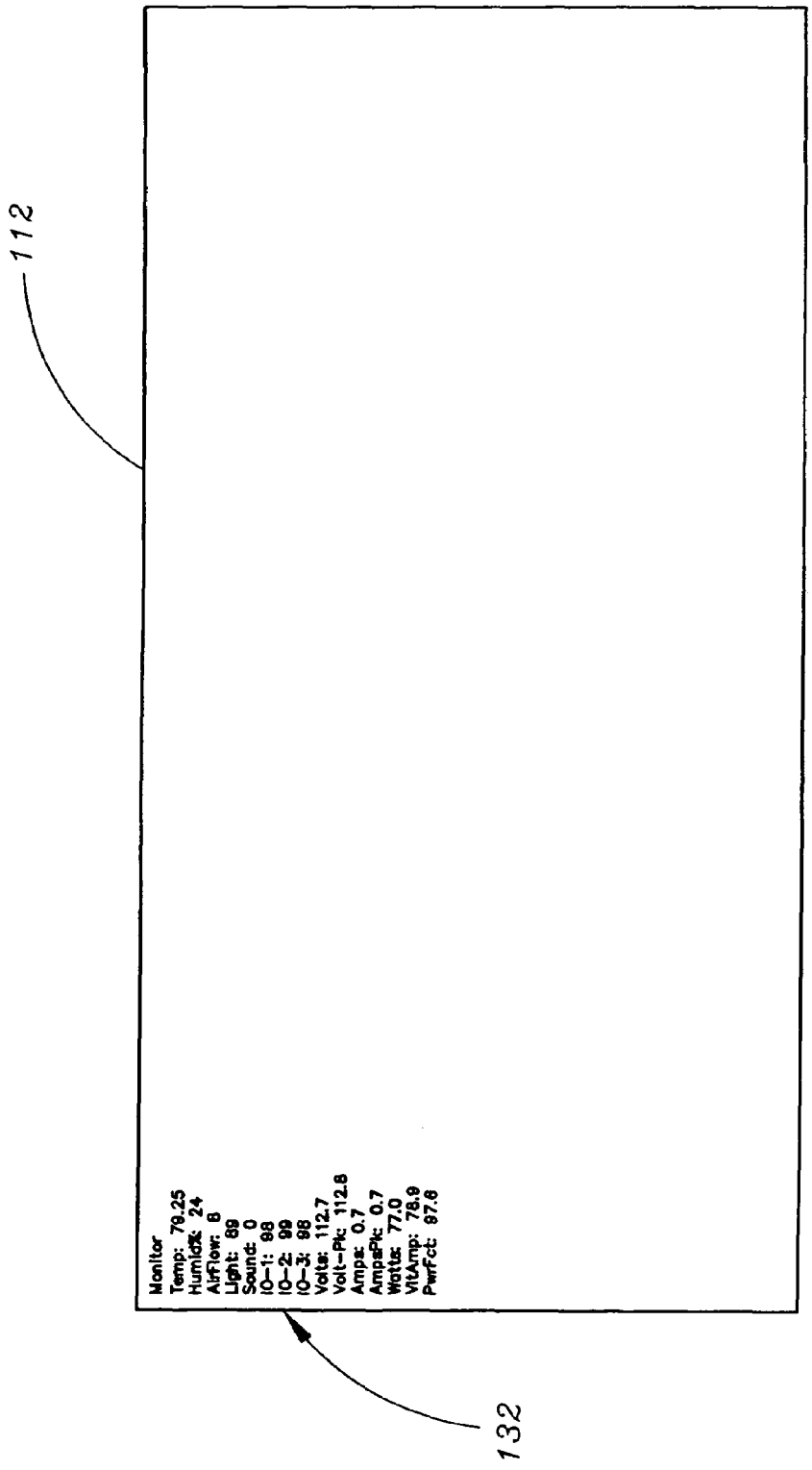
FIG. 11 illustrates a common interface provided by a power and environmental monitoring system in accordance with an exemplary embodiment of the present invention, wherein the common interface is displayed in a WAP format.
Figure 12:
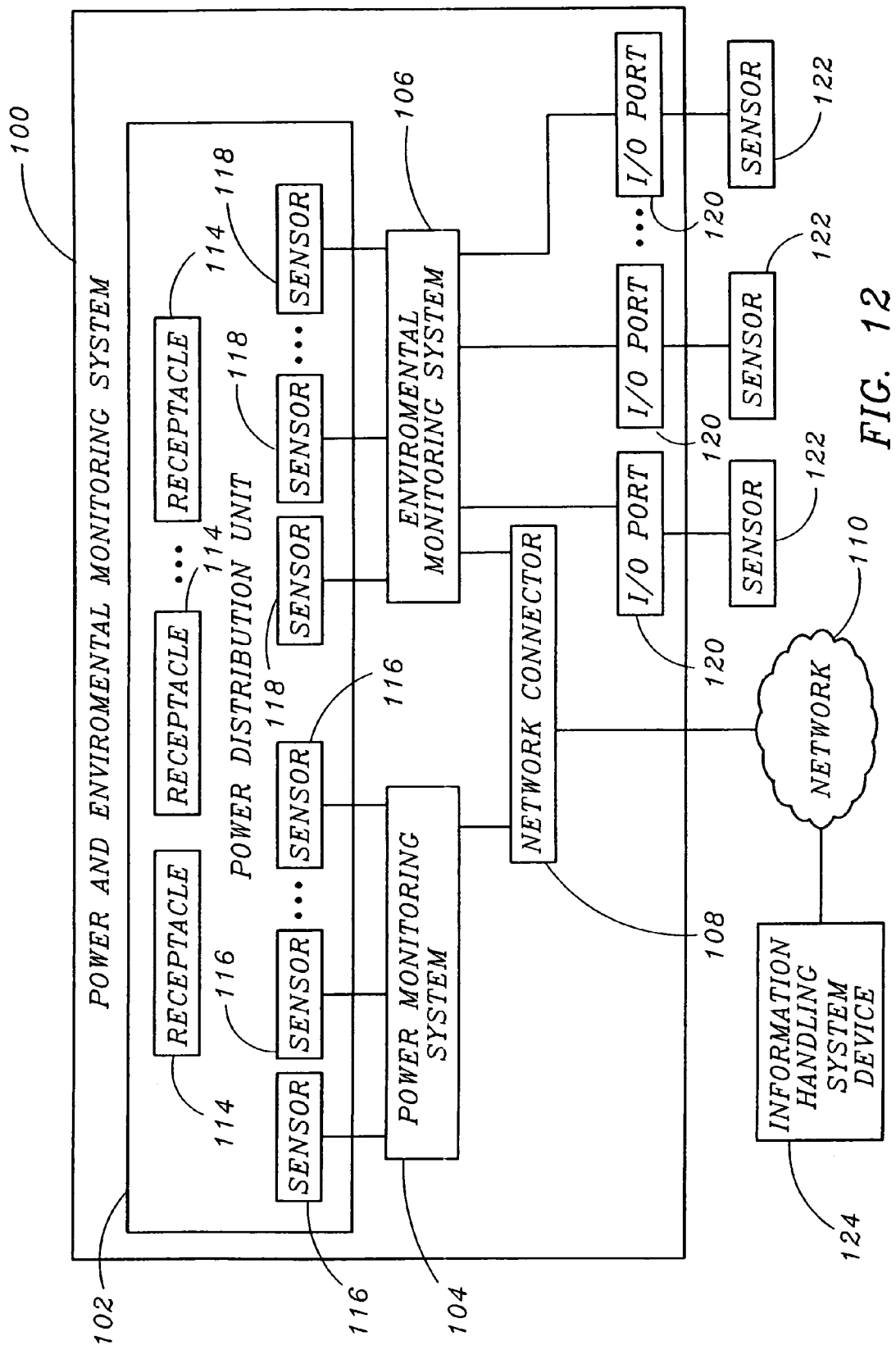
FIG. 12 is a block diagram illustrating a power and environmental monitoring system in accordance with an exemplary embodiment of the present invention, wherein the power and environmental monitoring system is connected to an information handling system device via a network.

In embodiments, the power and environmental monitoring system 100 provides the information handling system device 124 with a common interface 112 comprising Web pages for displaying the power consumption characteristics and the environmental characteristics sensed by the power monitoring system 104 and the environmental monitoring system 106. In an exemplary embodiment illustrated in FIGS. 5 through 9, the power and environmental monitoring system 100 utilizes HTTP and/or HTTPS (secure) for providing the common interface 112 to a Web browser installed on the information handling system device 124. In this embodiment, the information handling system device 124 includes a full size display monitor, or another device large enough to display an interface including graphs, text entry boxes, user selection boxes, and the like. Preferably, the common interface 112 includes one or more hyperlinks 128 for providing interfaces configured for information handling system devices 124 including other types of displays. For example, common interface 112 may include a link for displaying the common interface 112 in a smaller version for compatibility with a PDA, a mobile telephone, or another information handling system device 124 including a smaller sized display monitor, as illustrated in FIG. 10. Similarly, another link may be included for displaying the common interface 112 in a WAP format, as illustrated in FIG. 11. Those of skill in the art will appreciate that other links may be included as well, for providing common interfaces 112 configured for information handling system devices 124 having displays other than those specifically described herein.

In embodiments, the power and environmental monitoring system 100 maintains a database of power consumption characteristics and environmental characteristics sensed by the power monitoring system 104 and the environmental monitoring system 106. Preferably this database is stored by the power and environmental monitoring system 100, such as electronically stored within a local memory comprising Random Access Memory (RAM), Electrically Erasable Programmable Read Only Memory (EEPROM), flash memory, or another type of memory as contemplated by one of skill in the art. In embodiments, the hyperlinks 128 included with the common interface 112 include a link for providing the common interface 112 (comprising the database of power consumption characteristics and environmental characteristics) in an XML format. Further, another link may be included for downloading MIB contents of the database of power consumption characteristics and environmental characteristics. Those of skill in the art will appreciate that other links may be included as well, for providing the common interface 112 in other formats and protocols without departing from the scope and intent of the present invention.

Referring generally to FIGS. 5 through 11, an exemplary common interface 112 for displaying power consumption characteristics and environmental characteristics sensed by the power monitoring system 104 and the environmental monitoring system 106 is described. In embodiments, the common interface 112 comprises a series of Web pages which are provided to a Web browser installed on the information handling system device 124, as illustrated in FIGS. 5 through 9. As previously described, the exemplary common interface 112 includes hyperlinks 128 for providing the common interface 112 in a smaller version for compatibility with a PDA, as illustrated in FIG. 10, and/or in a WAP format, as illustrated in FIG. 11. Preferably, the common interface 112 is configured for presenting the power consumption characteristics and the environmental characteristics in the form of real time data and/or graphs for monitoring and trend analysis.

Figure 5:
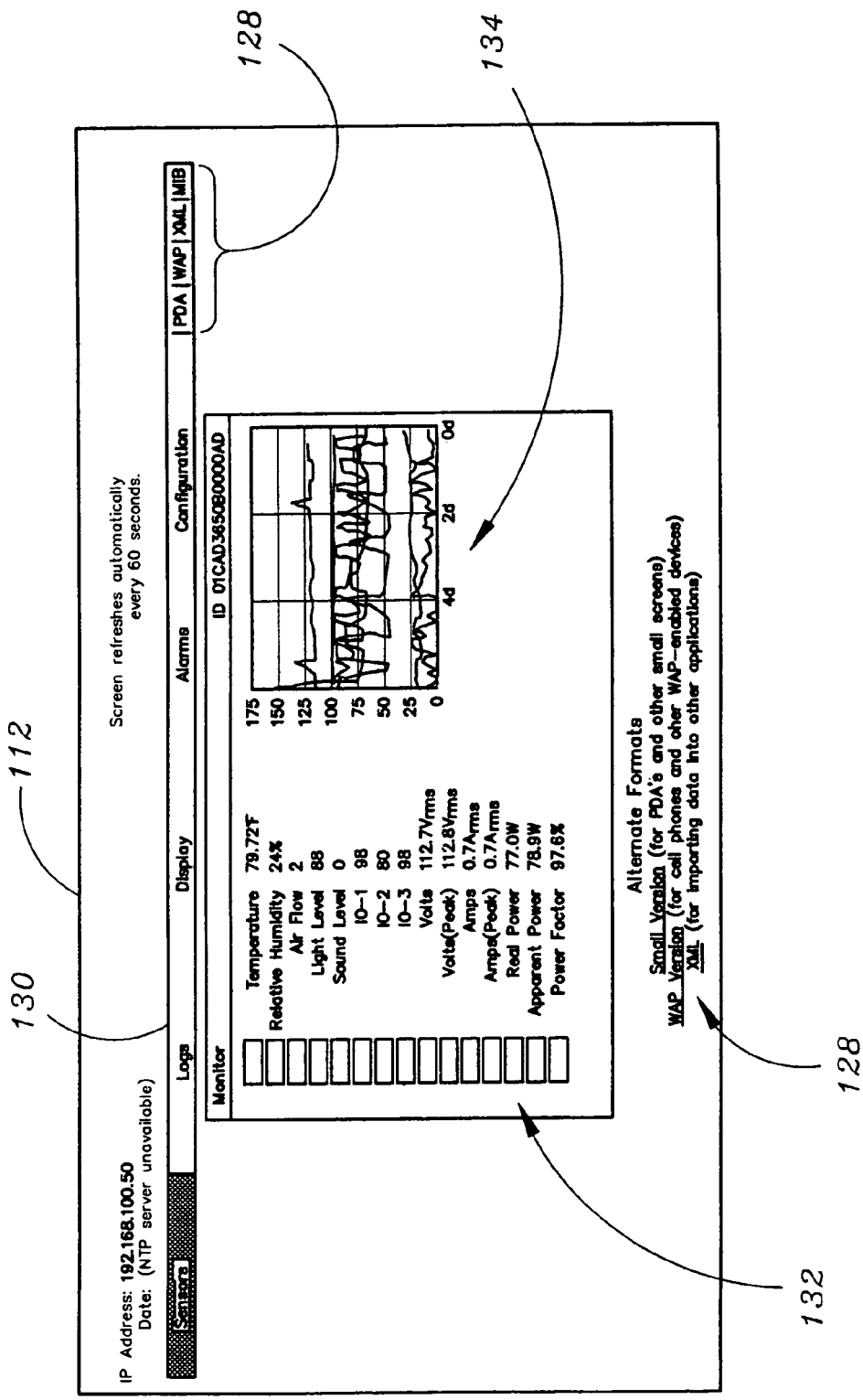
FIG. 5 illustrates a sensors page for a common interface provided by a power and environmental monitoring system in accordance with an exemplary embodiment of the present invention, wherein the sensors page displays real time data representing power consumption characteristics and environmental characteristics.

In the embodiment illustrated in FIGS. 5 through 9, the common interface 112 includes tabs 130 allowing an operator to select from a variety of Web pages supplied by the common interface 112. By selecting a tab labeled "Sensors," the operator is presented with real time data 132 representing power consumption characteristics and environmental characteristics sensed by the power monitoring system 104 and the environmental monitoring system 106, as illustrated in FIG. 5. Further, a real time graph 134 may be provided for displaying power consumption characteristics and environmental characteristics which have been measured in real time along with power consumption characteristics and environmental characteristics which have been measured previously. Preferably, these characteristics are stored within the local memory of the power and environmental monitoring system 100, as previously described. It is contemplated that additional information collected with the power consumption characteristics and the environmental characteristics may be stored in the local memory as well, including information describing when the characteristics were measured, as well as other data pertaining to the characteristics. Preferably, such information is associated with corresponding power consumption characteristics and environmental characteristics in the local memory of the power and environmental monitoring system 100, as is well known in the art. For instance, in a specific embodiment, the power and environmental monitoring system 100 is configured for automatically updating an internal clock from a preset time server accessible via the network 110. Then, when a characteristic is sensed by either of the power monitoring system 104 and the environmental monitoring system 106 and stored within the local memory of the power and environmental monitoring system 100, the time at which the characteristic was sensed is associated with the characteristic and stored in the local memory as well. Further, if an external web/IP camera is linked to the power and environmental monitoring system 100, camera information can be displayed with other summary information collected by the system, such as the real time data 132.

Figure 6:
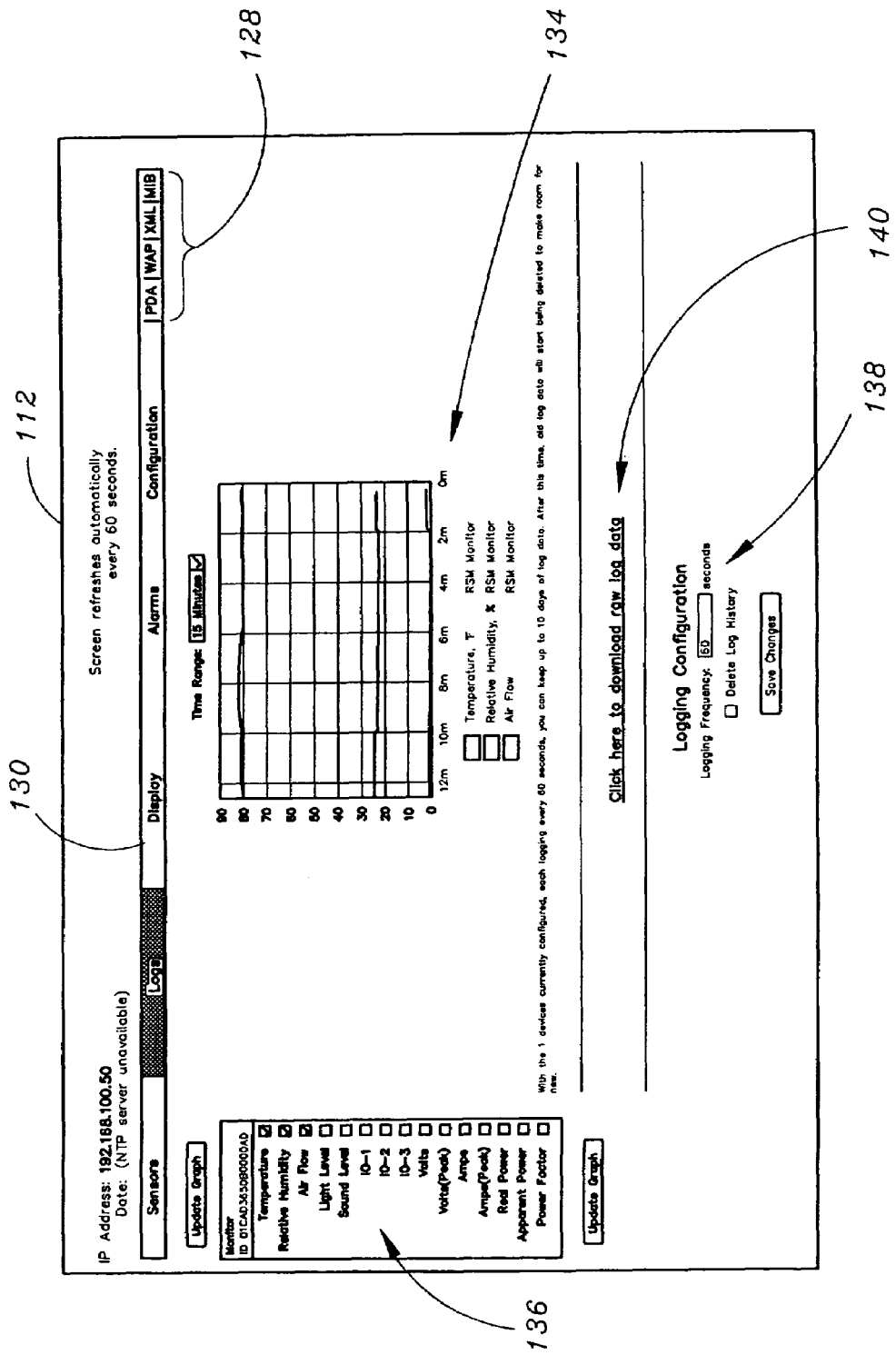
FIG. 6 illustrates a logs page for a common interface provided by a power and environmental monitoring system in accordance with an exemplary embodiment of the present invention, wherein the logs page displays a real time graph representing power consumption characteristics and environmental characteristics.

By selecting a tab labeled "Logs," the operator is presented with real time graph 134 representing power consumption characteristics and environmental characteristics which have been sensed by the power monitoring system 104 and the environmental monitoring system 106 in real time, along with power consumption characteristics and environmental characteristics which have been sensed previously, as illustrated in FIG. 6. In embodiments, the common interface 112 is configured for allowing an operator to specify desired power consumption characteristics and environmental characteristics for the real time graph 134. For example, a list of power consumption characteristics and environmental characteristics 136 may include check boxes, radio buttons, and other selection mechanisms as contemplated by one of skill in the art, allowing an operator to specify desired power consumption characteristics and environmental characteristics by selecting the characteristics from the list 136. These desired characteristics are then displayed by the real time graph 134.

In embodiments, the real time graph 134 includes a user-definable time range, for controlling the amount of data displayed by the real time graph 134. For example, in a specific embodiment, an operator selects a timeframe comprising 15 minutes worth of data for display by the real time graph 134. It is contemplated that the real time graph 134 may include other user-definable characteristics as well (e.g., data labels, axis ranges and scales, gridlines, legends, and the like). Moreover, it will be appreciated that the real time graph 134 may include various pictorial devices, such as a line graph, a scatter plot, a bar graph, a pie chart, and other pictorial devices for quantitatively illustrating power consumption characteristics and environmental characteristics as contemplated by one of skill in the art.

Preferably, an operator may select a desired logging frequency, for determining how often power consumption characteristics and environmental characteristics sensed by the power monitoring system 104 and the environmental monitoring system 106 are logged (i.e., stored by the power and environmental monitoring system 100). For example, a dialogue box 138 allows an operator to enter a desired logging frequency for determining how often the power consumption characteristics and the environmental characteristics are stored in the local memory of the power and environmental monitoring system 100. While the exemplary embodiment described in FIG. 6 includes dialogue box 138, it is contemplated that multiple dialogue boxes may be provided for specifying differing logging frequencies for various ones of the power consumption characteristics and the environmental characteristics, such as providing a differing logging frequency for a single characteristic, or, alternatively, a differing logging frequency for a subset of characteristics in the list of power consumption characteristics and environmental characteristics 136. In this manner, it is contemplated that various logging frequencies may be specified for various power consumption characteristics and environmental characteristics as necessary.

Those of skill in the art will appreciate that the number of power consumption characteristics and environmental characteristics stored by the power and environmental monitoring system 100 may be limited by the amount of storage space available (e.g., limited by the storage capacity of local memory). For this reason, the common interface 112 is preferably configured for alerting an operator to a time period for which power consumption characteristics and environmental characteristics are retained by the power and environmental monitoring system 100 (e.g. stored in local memory). Preferably, older power consumption characteristics and environmental characteristics (i.e. previously sensed characteristics) are replaced by newer power consumption characteristics and environmental characteristics (i.e., characteristics which have been sensed in real time). In exemplary embodiments, power consumption characteristics and environmental characteristics may be archived to a device other than the power and environmental monitoring system 100 as well, such as the information handling system device 124 connected to the network 110, or another device as contemplated by one of skill in the art. Further, it will be appreciated that the power and environmental monitoring system 100 may utilize flash memory, or a like storage medium, for storing the power consumption characteristics and environmental characteristics in case of a power loss or reboot.

In embodiments, the common interface 112 includes a hyperlink 140 for providing raw data stored in the local memory of the power and environmental monitoring system 100. For instance, in one specific embodiment, by utilizing the hyperlink 140, an operator of the information handling system device 124 may download a comma delimited file comprising power consumption characteristics and environmental characteristics stored by the power and environmental monitoring system 100, as well as additional information stored with the power consumption characteristics and the environmental characteristics, including information describing when the characteristics were measured, and other data pertaining to the characteristics. Those of skill in the art will appreciate that the power consumption characteristics and the environmental characteristics may be supplied by the power and environmental monitoring system 100 in a variety of formats without departing from the scope and intent of the present invention.

Figure 7:
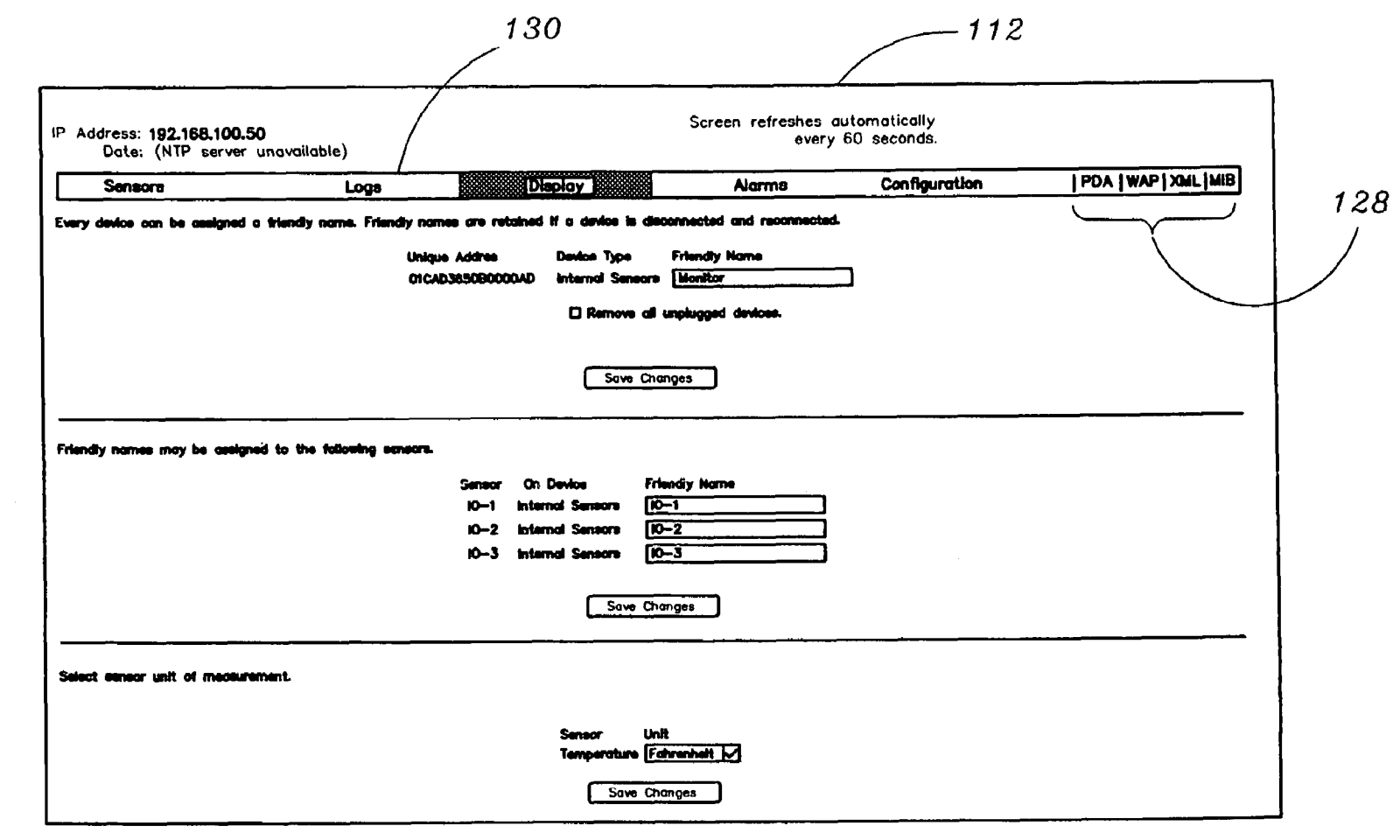

By selecting a tab labeled "Display," the operator is able to configure the power and environmental monitoring system 100 and provide a user friendly environment, as illustrated in FIG. 7. Preferably, internal sensors 116, internal sensors 118, and external sensors 122 may be renamed with descriptive (friendly) names utilizing the common interface 112. For example, in the embodiment illustrated in FIG. 7, internal sensors 116 are assigned the friendly name "Monitor," while specific ones of the internal sensors 116 are assigned friendly names including "IO-1," "IO-2," and "IO-3." Correspondingly, when an external sensor 122 is added to the power and environmental monitoring system 100, the external sensor 122 may be renamed utilizing a dialogue box, or a like interface, provided by the common interface 112. Preferably, each external sensor 122 has a unique address and is added to the common interface 112 as it is discovered (e.g., automatically detected) by the power and environmental monitoring system 100. In embodiments, the main name of the power and environmental monitoring system 100 may be changed to a friendly name as well, such as for differentiating between various power and environmental monitoring systems 100 connected to the network 110.

Preferably, an operator may select units of measurement in which various ones of the power consumption characteristics and the environmental characteristics are displayed, such as when the power consumption characteristics and the environmental characteristics are displayed as real time data 132 and/or real time graph 134. For instance, in the embodiment illustrated in FIG. 7, environmental characteristics collected from an internal sensor 116 for measuring temperature may be presented in Fahrenheit units, or, alternatively, in Celsius units. It is further contemplated that units of measurement may be assigned to a single characteristic, or, alternatively, to a subset of characteristics in the list of power consumption characteristics and environmental characteristics 136 (e.g., an operator may specify that temperature measurements in the list of power consumption characteristics and environmental characteristics 136 are displayed in Fahrenheit). Moreover, an operator may designate units of measurement for an external sensor 122 as it is discovered (e.g., automatically detected) by the power and environmental monitoring system 100, such as entering units of measurement in a dialogue box or a like interface. Those of skill in the art will appreciate that various units of measurement may be specified for various power consumption characteristics and environmental characteristics utilizing the common interface 112 without departing from the scope and intent of the present invention.

Figure 8:
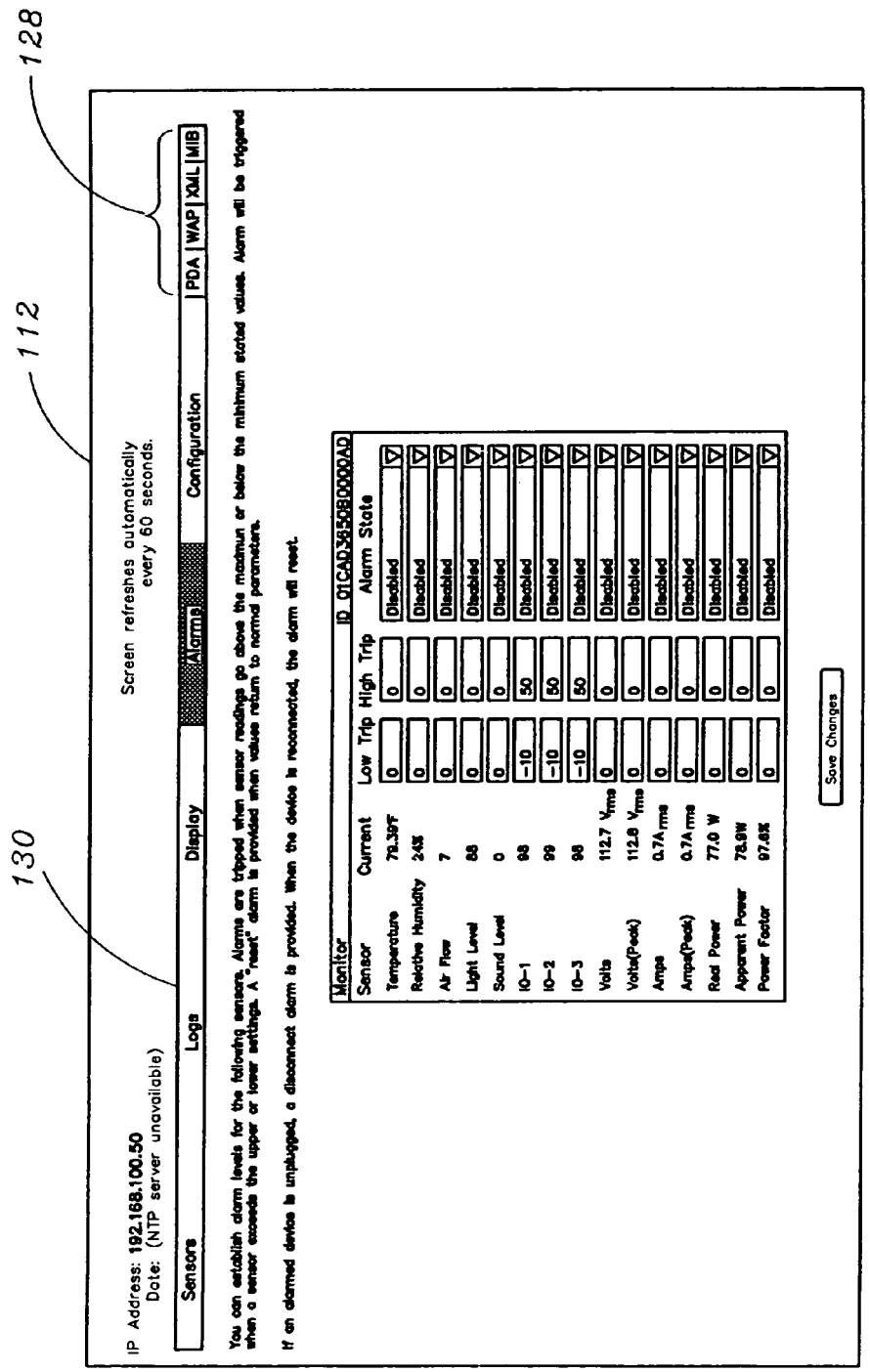
FIG. 8 illustrates an alarms page for a common interface provided by a power and environmental monitoring system in accordance with an exemplary embodiment of the present invention, wherein the alarms page allows an operator to set alarm thresholds, as well as enable and disable alarms for the various thresholds.

In embodiments, the power and environmental monitoring system 100 provides an alarm for alerting an operator that a characteristic sensed by the power monitoring system 104 and the environmental monitoring system 106 has reached an alarm threshold. Preferably, the common interface 112 is configured for setting alarm thresholds for various ones of the power consumption characteristics and environmental characteristics, as well as for enabling and disabling an alarm. For instance, by selecting a tab labeled "Alarms," the operator is able to configure the power and environmental monitoring system 100 and set alarm thresholds comprising high and low limits for the various characteristics sensed by the power monitoring system 104 and the environmental monitoring system 106, as well as enable and disable alarms for the various thresholds, as illustrated in FIG. 8. Alternatively, the operator is able to configure the power and environmental monitoring system 100 and set alarm thresholds for calculated parameters (e.g., when a monitored characteristic is converted to an equivalent value having alternative units of measurement).

In other exemplary embodiments, the operator is able to configure the power and environmental monitoring system 100 and set alarm thresholds for various combinations of power consumption characteristics and environmental characteristics, calculated parameters, and additional information collected with the characteristics, including information describing when the characteristics were measured, as well as other data pertaining to the characteristics. For example, the operator may configure the power and environmental monitoring system 100 to trigger an alarm when a combination of characteristics comprising a temperature measurement and a power factor measurement are sensed within a pre-specified time interval. Those of skill in the art will appreciate that various characteristics, calculated parameters, and additional information collected with the power consumption characteristics and the environmental characteristics may be utilized in a variety of ways for triggering an alarm without departing from the scope and intent of the present invention. Further, it will be appreciated that the common interface 112 may comprise a variety of interfaces for setting alarm thresholds, as contemplated by one of skill in the art.

Figure 9:
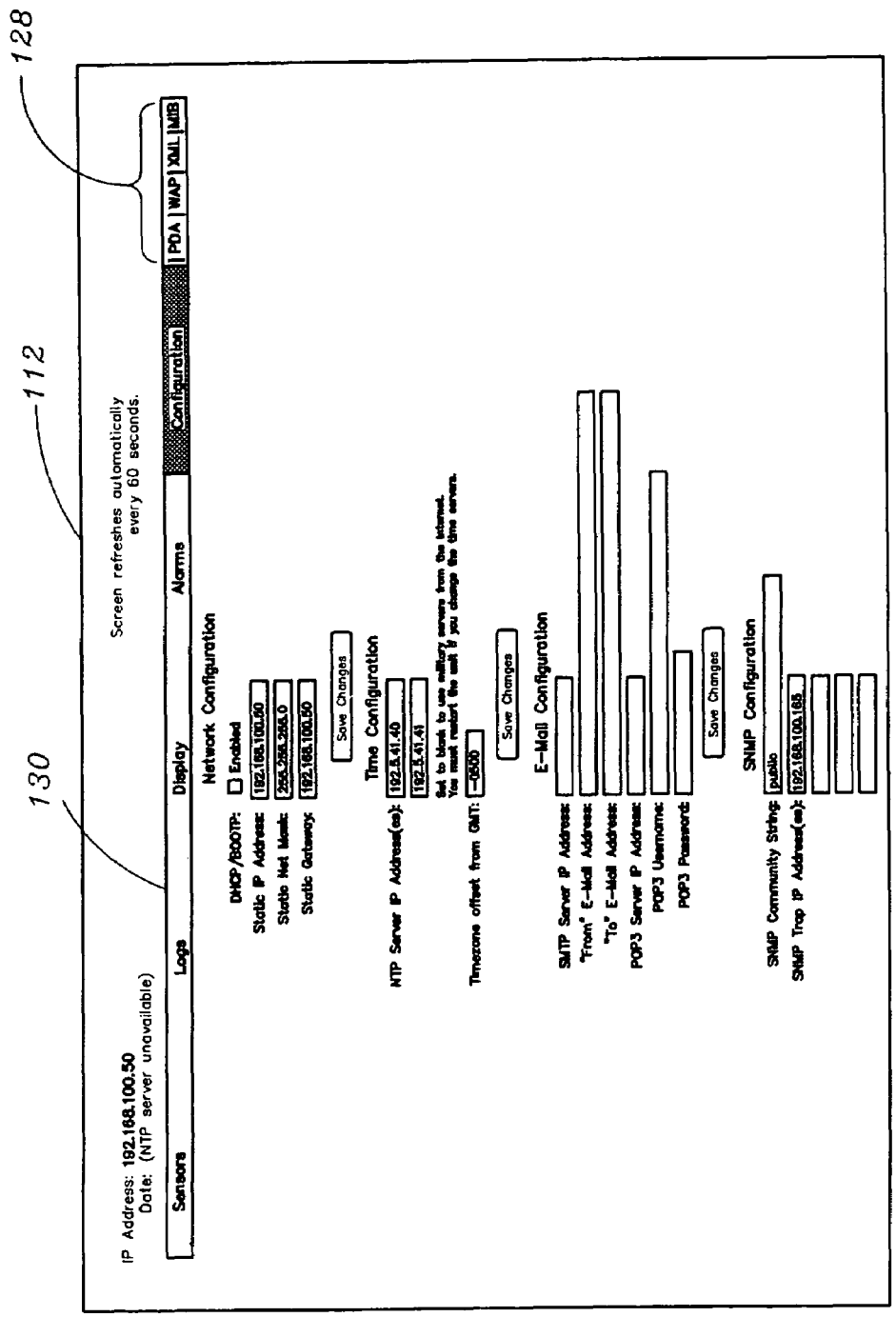
FIG. 9 illustrates a configuration page for a common interface provided by a power and environmental monitoring system in accordance with an exemplary embodiment of the present invention, wherein the configuration page allows an operator to define alarm actions for alarms and assign network properties.

By selecting a drop down menu called 'Alarm State' on the 'ALARMS' page, an operator is able to utilize the common interface 112 to define alarm actions for alarms provided by the power and environmental monitoring system 100, as illustrated in FIG. 9. For instance, an alarm for alerting the operator that a characteristic has reached an alarm threshold may be defined as an audible or visual alarm for the tethered display 126, an e-mail or an SNMP trap sent to the information handling system device 124 by the power and environmental monitoring system 100 via the network 110, and various other alarms and combinations thereof as contemplated by one of skill in the art. Additionally, it should be noted that different alarms and alarm combinations may be defined for various combinations of power consumption characteristics and environmental characteristics, calculated parameters, and additional information collected with the characteristics. Then, when a power consumption characteristic is sensed by the power monitoring system 104, or an environmental characteristic is sensed by the environmental monitoring system 106, and the power and environmental monitoring system 100 detects that either characteristic has reached an alarm threshold, the alarm is transmitted via the network connector 108 to the information handling system device 124, or to another device connected to the power and environmental monitoring system 100, such as the tethered display 126.

In embodiments, a network camera (e.g., a webcam set to allow anonymous network access) is linked to the power and environmental monitoring system 100 via the network 110. Preferably, the common interface 112 is configured for receiving an Internet Protocol (IP) address, or, alternatively, another network address, for the network camera. A live image from the network camera is then displayed via the common interface 112 provided by the power and environmental monitoring system 100, such as displayed on the "Sensors" page illustrated in FIG. 5. (Alternatively, the common interface 112 may display a live image from a network camera connected to the power and environmental monitoring system 100 via an I/O port 120.) Preferably, the "Sensors" page is configured for automatically updating/refreshing at a preset/programmed refresh rate or as selected by the user. For example, in one specific embodiment, the "Sensors" page is automatically refreshed according to the logging frequency provided via the dialogue box 138. In this embodiment, a live image from the network camera may be displayed each time the "Sensors" page refreshes. In embodiments, the image from the network camera provided on the "Sensors" page includes a link to a live video feed from the network camera which may be provided by the common interface 112 as is well known in the art.

In embodiments, the power and environmental monitoring system 100 includes a static IP address for access via the network 110, such as for initial setup and configuration. Preferably, the static IP address is supplied with the power and environmental monitoring system 100, such as printed on the front of the power distribution unit 102, or the like. Exemplary power and environmental monitoring systems 100 include functionality accessible via the common interface 112 for assigning network properties, including user-defined IP addresses, net mask addresses, gateway addresses, and other network properties as necessary. Preferably, such user-defined network properties are stored in flash memory or a like storage medium, for retaining last assigned addresses in case of a power loss or reboot. In embodiments, the power and environmental monitoring system 100 is Dynamic Host Configuration Protocol (DHCP) capable for obtaining an IP address from a DHCP server and connecting to the network 110. Moreover, the common interface 112 may be configured for accepting an IP address for a Network Time Protocol (NTP) server, or another preset time server, for automatically updating an internal clock included with the power and environmental monitoring system 100. Those of skill in the art will appreciate that the power and environmental monitoring system 100 may be assigned a variety of static and dynamic IP addresses, as well as configured with services accessible utilizing a variety of static and dynamic IP addresses without departing from the scope and intent of the present invention.

In embodiments, the common interface 112 provides multiple levels of access to the power and environmental monitoring system 100. For instance, read only/view only accounts, administrator accounts, and various other levels of access may be included for limiting access via the common interface 112 as required. Further, the multiple levels of access may be maintained by multiple levels of usernames, passwords, and other security measures as contemplated by one of skill in the art. In a specific embodiment, when no accounts have been created, an operator may access configuration settings for the power and environmental monitoring system 100 (e.g., via the common interface 112), as well as view power consumption characteristics and environmental characteristics sensed by the power monitoring system 104 and the environmental monitoring system 106.

When an administrator account (i.e., an account including a first username and password) is activated, only an operator logged into the power and environmental monitoring system 100 via the administrator account may access configuration settings provided via the common interface 112 (e.g., Web pages including such configuration settings), as well as view the power consumption characteristics and the environmental characteristics. Further, an administrator may create a read only account (i.e., an account including a second username and password) which allows an operator logged in via the read only account to view the power consumption characteristics and the environmental characteristics, while excluding access to other operators. Preferably, the administrator account must be activated in order to activate the read only account. Those of skill in the art will appreciate that a variety of techniques may be utilized for providing multiple levels of access to the power and environmental monitoring system 100, as well as to the common interface 112 without departing from the scope and intent of the present invention.

In embodiments, the power and environmental monitoring system 100 is compact, for being positioned in various locations and at various orientations within a server rack, or in other locations throughout a data center, or a similar environment where space may be limited. For instance, in one specific embodiment, the power distribution unit 102 has a long, narrow profile, including four long, narrow sides and two ends, wherein each side is 1.61 inches wide and oriented at 90 degrees from adjacent sides. This square cross-sectional profile allows the power and environmental monitoring system 100 to accept a mounting clip for mounting the power distribution unit 102 such that any desired side may be positioned away from the mounting clip. Additionally, a mounting bracket may be fastened to either end of the power and environmental monitoring system 100 and the power distribution unit 102 may be oriented in a variety of directions. Those of skill in the art will appreciate that the power and environmental monitoring system 100 may have other compact shapes and profiles without departing from the scope and spirit of the present invention.

Those of skill in the art will appreciate that the power and environmental monitoring system 100 may be configured for remotely controlling power supplied to equipment coupled with the power distribution unit 102 via the receptacles 114. For example, in one specific embodiment, a user-specified receptacle 114 is alternately turned on and off utilizing the common interface 112. It is further contemplated that the common interface 112 may be configured for assigning a friendly name to a user-specified receptacle 114, and for providing power consumption characteristics sensed by the power monitoring system 104 for the receptacle 114.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A power and environmental monitoring system, comprising:
    a power distribution unit having a receptacle for supplying power to equipment coupled with the power distribution unit via the receptacle;
    a power monitoring system for monitoring a power consumption characteristic of the power supplied to the equipment coupled with the power distribution unit;
    an environmental monitoring system for monitoring an environmental characteristic in a physical environment occupied by the power and environmental monitoring system;
    a network connector for connecting the power and environmental monitoring system to a network, and
    a common interface accessible via the network connector, wherein the power monitoring system and the environmental monitoring system share the common interface accessible via the network connector.

2. The power and environmental monitoring system as claimed in claim 1,
    wherein the power monitoring system comprises
        an internal sensor disposed in the power distribution unit for sensing the power consumption characteristic,
    the power consumption characteristic comprising
        one or more of voltage, current, and power factor.

3. The power and environmental monitoring system as claimed in claim 1,
    wherein the environmental monitoring system comprises
        an internal sensor disposed in the power distribution unit for sensing the environmental characteristic,
    the environmental characteristic comprising
        one or more of temperature, humidity, airflow, light level, and sound level.

4. The power and environmental monitoring system as claimed in claim 1, further comprising
an input/output (I/O) port for connecting an external sensor disposed outside of the power distribution unit,
wherein the environmental monitoring system is configured for receiving a second environmental characteristic sensed by the external sensor.

5. The power and environmental monitoring system as claimed in claim 4,
wherein the external sensor comprises one or more of
a temperature sensor having a temperature probe;
a combined temperature and airflow sensor;
a combined temperature and humidity sensor;
a combined temperature, airflow, and humidity sensor;
an external contact closure type sensor for acting as a conductivity bridge;
a magnetic switch;
a smoke alarm;
an air quality monitor; and
a power monitor.

6. The power and environmental monitoring system as claimed in claim 1,
wherein the power and environmental monitoring system provides an alarm for alerting an operator that one or more of the power consumption characteristic and the environmental characteristic has reached an alarm threshold.

7. The power and environmental monitoring system as claimed in claim 6,
wherein the common interface is configured for setting the alarm threshold.

8. The power and environmental monitoring system as claimed in claim 1,
wherein the common interface comprises a Web page supplied via the network connector, the Web page for displaying one or more of the power consumption characteristic and the environmental characteristic.

9. A system for performing power and environmental monitoring in a power distribution unit, the power distribution unit having a receptacle for supplying power to equipment coupled with the power distribution unit via the receptacle, the system comprising:
a power monitoring system for monitoring a power consumption characteristic of the power supplied to the equipment coupled with the power distribution unit;
an environmental monitoring system for monitoring an environmental characteristic in a physical environment occupied by the system;
a network connector for connecting the power and environmental monitoring system to a network, and
a common interface accessible via the network connector,
wherein the power monitoring system and the environmental monitoring system share the common interface accessible via the network connector.

10. The system as claimed in claim 9,
wherein the power monitoring system comprises an internal sensor disposed in the power distribution unit for sensing the power consumption characteristic, the power consumption characteristic comprising one or more of voltage, current, and power factor.

11. The system as claimed in claim 9,
wherein the environmental monitoring system comprises an internal sensor disposed in the power distribution unit for sensing the environmental characteristic, the environmental characteristic comprising one or more of temperature, humidity, airflow, light level, and sound level.

12. The system as claimed in claim 9, further comprising an input/output (I/O) port for connecting an external sensor disposed outside of the power distribution unit,
wherein the environmental monitoring system is configured for receiving a second environmental characteristic sensed by the external sensor.

13. The system as claimed in claim 12,
wherein the external sensor comprises one or more of a temperature sensor having a temperature probe; a combined temperature and airflow sensor; a combined temperature and humidity sensor; a combined temperature, airflow, and humidity sensor; an external contact closure type sensor for acting as a conductivity bridge; a magnetic switch; a smoke alarm; an air quality monitor; and a power monitor.

14. The system as claimed in claim 9,
wherein the system provides an alarm for alerting an operator that one or more of the power consumption characteristic and the environmental characteristic has reached an alarm threshold.

15. The system as claimed in claim 14,
wherein the common interface is configured for setting the alarm threshold.

16. The system as claimed in claim 9,
wherein the common interface comprises a Web page supplied via the network connector, the Web page for displaying one or more of the power consumption characteristic and the environmental characteristic.

17. A method for performing power and environmental monitoring utilizing a power and environmental monitoring system, the power and environmental monitoring system comprising a power distribution unit having a receptacle for supplying power to equipment coupled with the power distribution unit via the receptacle, a power monitoring system for monitoring a power consumption characteristic of the power supplied to the equipment coupled with the power distribution unit, an environmental monitoring system for monitoring an environmental characteristic in a physical environment occupied by the power and environmental monitoring system, a network connector for connecting the power and environmental monitoring system to a network, and a common interface accessible via the network connector, wherein the power monitoring system and the environmental monitoring system share the common interface accessible via the network connector, the method comprising:
sensing the power consumption characteristic utilizing the power monitoring system;
sensing the environmental characteristic utilizing the environmental monitoring system;
detecting when one or more of the power consumption characteristic and the environmental characteristic has reached an alarm threshold; and
transmitting an alarm via the network connector when the alarm threshold is detected.

18. The method as claimed in claim 17, the power and environmental
monitoring system further comprising an input/output (I/O) port for connecting an external sensor disposed outside of the power distribution unit, the environmental monitoring system configured for receiving a second environmental characteristic sensed by the external sensor, and the method further comprising:
sensing the second environmental characteristic utilizing the environmental monitoring system; and
detecting when the second environmental characteristic has reached a second alarm threshold, wherein the alarm is transmitted via the network connector when the second alarm threshold is detected.

19. The method as claimed in claim 17, further comprising setting the alarm threshold utilizing the common interface.

20. The method as claimed in claim 17, wherein the alarm comprises one or more of an audible alarm, a visual alarm, an e-mail, and an SNMP trap.

* * * * *